United States Patent
Chumbes

(10) Patent No.: US 12,243,936 B2
(45) Date of Patent: Mar. 4, 2025

(54) AlN CHANNEL HETEROSTRUCTURE FIELD EFFECT TRANSISTOR

(71) Applicant: Raytheon Company, Waltham, MA (US)

(72) Inventor: Eduardo M. Chumbes, Andover, MA (US)

(73) Assignee: Raytheon Company, Arlington, VA (US)

( * ) Notice: Subject to any disclaimer, the term of this patent is extended or adjusted under 35 U.S.C. 154(b) by 545 days.

(21) Appl. No.: 17/646,178

(22) Filed: Dec. 28, 2021

(65) Prior Publication Data

US 2023/0207677 A1    Jun. 29, 2023

(51) Int. Cl.
  *H01L 29/778*  (2006.01)
  *H01L 29/04*   (2006.01)
  *H01L 29/20*   (2006.01)

(52) U.S. Cl.
  CPC .......... *H01L 29/7786* (2013.01); *H01L 29/04* (2013.01); *H01L 29/2003* (2013.01)

(58) Field of Classification Search
  CPC .................... H01L 29/7786; H01L 29/267
  See application file for complete search history.

(56) References Cited

U.S. PATENT DOCUMENTS

| | | | |
|---|---|---|---|
| 8,575,666 B2 | 11/2013 | LaRoche et al. | |
| 9,899,505 B2 | 2/2018 | Radosavljevic et al. | |
| 10,032,898 B2 | 7/2018 | Iucolano et al. | |
| 10,109,632 B2 | 10/2018 | Mitsunaga | |
| 11,056,580 B2 | 7/2021 | Ye | |
| 11,101,378 B2 | 8/2021 | Hwang et al. | |
| 11,114,539 B2 | 9/2021 | Ramdani | |
| 11,177,216 B2 | 11/2021 | LaRoche et al. | |
| 2006/0011915 A1* | 1/2006 | Saito | H01L 29/1066 257/E29.252 |
| 2019/0074174 A1 | 3/2019 | Okamoto et al. | |
| 2019/0189773 A1* | 6/2019 | Ningaraju | H01L 29/432 |
| 2020/0328297 A1* | 10/2020 | Li | H01L 29/2003 |
| 2021/0050474 A1* | 2/2021 | Krause | H01L 33/0041 |

OTHER PUBLICATIONS

Liu et al. "Interface/border trap characterization of Al2O3/AlN/GaN metal-oxide-semiconductor structures with an AlN interfacial layer" in Applied Physics Letters 106 051605 (2015) (Year: 2015).*
M. Kneib, et al, Tin-assisted heteroepitaxial PLD-growth of κ-$Ga_2O_3$ Thin Films with High Crystalline Quality, APL Mater 7 022516, 2019, 12 pages.
Sierra Seacat, et al, Orthorhombic Alloys of $GaZ_2O_3$ and $Al_2O_3$, Appl. Phys. Lett. 116, 232102, 2020, 5 pages.

(Continued)

*Primary Examiner* — Erik Kielin

(57) ABSTRACT

A semiconductor device having a substrate and an orthorhombic polar crystalline oxide k-$Al_2O_3$ layer epitaxially and heterogeneously integrated above a wurtzite single-crystal Group III-Nitride layer comprising AlN disposed above the substrate.

20 Claims, 2 Drawing Sheets

(56) References Cited

OTHER PUBLICATIONS

Praneeth Ranga et al, Highly Tunable, Polarization-engineered 2DEG in e-AlGaO$_3$/e-Ga$_2$O$_3$ Heterostructures, Applied Physics Express, 13, 061009, 2020, 6 pages.

Xiaoli Liu, et al, Investigations of monoclinic- and orthorhombic-based (B$_x$Ga$_{1-x}$)$_2$O$_3$ alloys, App. Phys. Lett., 117, 012104, 2020, 8 pages.

Xiaoli Liu, Cono Sammarco, Guosong Zeng, Daoyou Guo, Weihua Tang, Chee-Keong Tan, Investigations of monoclinic—and orthorhombic-based (BxGa$_{1-x}$)2°3 alloys, Applied Physics Letters Jul. 9, 2020, 8 pages.

Praneeth Ranga, Sung Beom Cho, Rohan Mishra, Sriramkrishnamoorthy, Highly tunable, polarization-engineered two-dimensional electron gas in E-AlGaO$_3$/ E-Ga$_2$O$_3$ heterostructures Applied Physics Express, 13, 061009, 2020, 6 pages.

Lee et al., "Enhancement-Mode Characteristics of Al$_{0.65}$Ga$_{0.35}$N/Al$_{0.3}$Ga$_{0.7}$N/AlN/SiC MOS-HFETs;" IEEE Journal of the Electron Devices Society, vol. 9; Oct. 20, 2021; 6 Pages.

Miao et al., "Oxidation and the Origin of the Two-Dimensional Electron Gas in AlGaN/GaN Heterostructures;" Journal of Applied Physics, vol. 107, No. 12; Jun. 22, 2010; 11 Pages.

Ranjan et al., "High-Performance Dual-Gate-Charge-Plasma-AlGaN/GaN MIS-HEMT;" Applied Physics A, vol. 126, No. 3; Feb. 8, 2020; 9 Pages.

PCT International Search Report and Written Opinion on Patentability dated Mar. 10, 2023 for International Application No. PCT/US2022/050025; 14 Pages.

* cited by examiner

| Material | Electron Drift Mobility [cm$^2$/(V·s)] | Breakdown Field Strength [MV/cm] | Thermal Conductivity [W/(m·K)] |
|---|---|---|---|
| Si | 1240 | 0.3 | 145 |
| 4H-SiC | 9.7 | 3.1 | 350 |
| β-Ga$_2$O$_3$ | 150 | 10.3 | 27 |
| GaN | 1000 | 5.0 | 140 |
| AlN | 426 | 15.4 | 319 |

AlN CHANNEL HETEROSTRUCTURE FIELD EFFECT TRANSISTOR

TECHNICAL FIELD

This disclosure relates generally to depletion mode High Electron Mobile Field Effect Transistor (HEMT) semiconductor devices and more particularly to depletion mode HEMT semiconductor devices having Schottky contact layers.

BACKGROUND

As is known in the art, active semiconductor devices such as for example, diodes and FETs (Field Effect Transistors) based on Group III-Nitride materials, such as GaN, AlGaN, InN, AlN, and ScAlN, have demonstrated excellent RF/Microwave performances, which are achieved with an optimization of material, process, device, and design technologies.

Transistor efficiency determines RF system range, sensitivity, power consumption, and reliability and operating at higher power densities comes with high power dissipation ($P_{diss}$). It is desirable to improve transistor power and efficiency performance, otherwise applications are potentially limited due to thermal management.

SUMMARY OF THE INVENTION

In accordance with the present disclosure, a semiconductor device is provided comprising: an orthorhombic polar crystalline oxide $\kappa$-$Al_2O_3$ layer epitaxially and heterogeneously integrated above a wurtzite single-crystal Group III-Nitride comprising AlN; a source and drain electrodes disposed over a conductive region in the polar $\kappa$-$Al_2O_3$ layer and partway into the AlN; and a gate electrode disposed between the source electrode and the drain electrode on top of polar $\kappa$-$Al_2O_3$ layer.

In one embodiment, the upper layer comprises $\kappa$-$B_2O_3$ or an alloy of $\kappa$-$Al_2O_3$ and $\kappa$-$B_2O_3$ (e.g., $\kappa$-$(Al_xB_{1-x})_2O_3$).

In another embodiment, the semiconductor structure is provided wherein a polarization discontinuity at the heterointerface between the $\kappa$-$Al_2O_3$ and AlN exists to induce a two-dimensional electron gas (2DEG) in the AlN side of the heterointerface.

The inventors have recognized that the benefits of using an AlN channel layer with a higher bandgap Schottky barrier layer in place of a GaN channel layer to take advantage of large breakdown and thermal conductivity properties of AlN to support ultra-high power density radio frequency (RF) transistors.

Still further, the inventors have recognized that the benefits of an AlN channel layer with a $\kappa$-$Al_2O_3$ barrier layer provides an overall larger polarization discontinuity and bandgap.

BRIEF DESCRIPTION OF THE DRAWINGS

The details of one or more embodiments of the disclosure are set forth in the accompanying drawings and the description below. Other features, objects, and advantages of the disclosure will be apparent from the description and drawings, and from the claims.

Like reference symbols in the various drawings indicate like elements.

DETAILED DESCRIPTION

Figure 1:
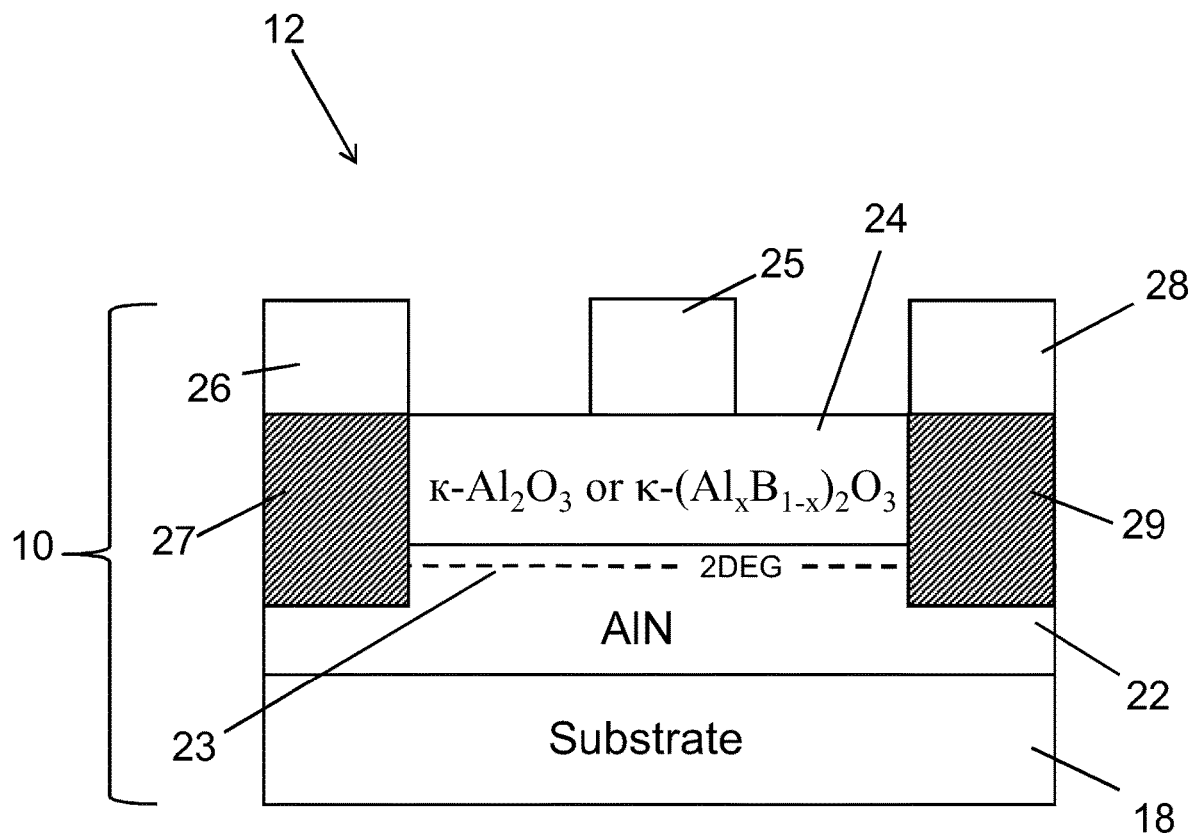
FIG. 1 is a diagrammatical sketch of a cross-section of a semiconductor device according to the disclosure.

Before departing on a detailed description of the invention, it should be noted the inventor has recognized that the benefits of replacing a GaN channel with AlN and using a polar oxide (kappa-phase $Al_2O_3$ or $\kappa$-$Al_2O_3$) as a barrier layer to supply greater than ten times carrier density to AlN via polarization. Using AlN as a channel layer has greater than four times the electric field strength of GaN and therefore can scale voltage by four times and has a greater than two and one half times higher thermal conductivity than GaN for improved thermal management. Homoepitaxy is possible with AlN substrates that currently exist.

The disclosure involves a heterostructure of kappa-phase $Al_2O_3$ as the barrier layer to an AlN channel. The very strong polarization of $Al_2O_3$ (greater than 9 times higher that of GaN and greater than 3 times of AlN) with the AlN channel (greater than 2.5 times larger thermal conductivity and greater than 4 times electric field strength of GaN (P. Ranga et al., "Highly tunable, polarization-engineered two-dimensional electron gas in $\varepsilon$-$AlGaO_3$/$\varepsilon$-$Ga_2O_3$ heterostructures", Appl. Phys. Exp. 13 061009 (2020))) solves the problem of delivering up to 40 times power density of current state-of-the-art GaN structures with improved thermal conductivity to handle the higher heat dissipation that other technologies cannot achieve without resorting to integrating to diamond. Moreover, AlN is closer lattice matched to diamond so the process to integrate kappa-$Al_2O_3$/AlN onto diamond is simpler. AlN substrates exist commercially, so homoepitaxy is possible.

As to be described, the structure enables up to 40 times higher power density of today's GaN structures with improved power dissipation handling integral to the transistor. The latter addresses and alleviates the thermal heat dissipation problem with ultra high power transistors today being pushed for power performance exceeding 8 W/mm where there are currently limited thermal cooling solutions to address which limit application to short duty cycle pulse applications only.

Diamond despite its higher thermal conductivity and potential for ultra-high power density performance has for decades not lived to the promise as it suffers from low carrier density and mobility resulting in transistors that are far less performance than current state-of-the-art GaN structures. Other semiconductor technologies that promise ultra-high power density performance over GaN suffer from poor thermal conductivity relying on complex process to integrate these semiconductors to diamond. None of these technologies have the combined high expected carrier density and mobility combined with high thermal conductivity in one semiconductor platform.

As to be described, with the high polarization properties of orthorhombic $\kappa$-$Al_2O_3$ (~3x of AlN) but also large bandgap of 7.7 eV (>1.5 eV higher than AlN); $\kappa$-$B_2O_3$ has even larger bandgap of 11.3 eV and can also be used as a barrier layer (See Appl. Phys. Lett. 117, 012104 (2020); https://dol.org/10.1063/5.0005808; Submitted: 25 Feb. 2020. Accepted 28 Jun. 2020. Published Online: 9 Jul. 2020).

Referring now to FIG. 1, a semiconductor structure 10 is shown having a depletion mode (D-mode) field effect transistor 12, here a D-mode HEMT. The D-mode HEMT 12 includes a source electrode 26, a drain electrode 28 and a gate electrode 25 disposed between the source electrode 26 and the drain electrode 28, as shown.

More particularly, the semiconductor structure 10 includes a single crystal substrate 18, here for example silicon (Si), silicon carbide (SiC), diamond or aluminum nitride (AlN), and an epitaxially grown AlN layer 22 forming nucleation, buffer and channel regions of a HEMT structure, and barrier layer 24 being one or more epitaxial grown polar oxide barrier materials, here $\kappa\text{-Al}_2\text{O}_3$ or as to be described below, alternatively, $\kappa\text{-B}_2\text{O}_3$. The oxide-nitride heterolayers 22 and 24 form a heterojunction that results in a 2DEG channel (indicated by dotted line 23) in the AlN layer 22. It is noted that the polar oxide layer 24 extends from an ohmic contact region 27 of the source electrode 26 to an ohmic contact region 29 of the drain electrode 28. The gate electrode 25 is in Schottky contact with the polar oxide layer 24. It is also noted that the source electrode 26 and drain electrode 28 are in ohmic contact with the AlN channel layer 22 via ohmic contact regions 27 and 29, respectively. Traditional ohmic contact formation involving thermal anneal of metal contacts in direct contact with the Schottky barrier is not viable as the mechanism involving the formation of nitrogen vacancies and elemental intermixing of the electrode and barrier material during thermal anneal that renders barrier layer in Group III-Nitride HEMTs conductive forming ohmic contact regions between the electrode and barrier material is absent with $\kappa\text{-Al}_2\text{O}_3$ barrier. The formation of the ohmic contact regions 27 and 29 in this structure is achieved either by ohmic recess or regrowth process wherein the ohmic contact regions 27 and 29 is either same source and drain electrode material 26 and 28 deposited by e-beam evaporation for example in the case of ohmic recess or a conductive AlN layer deposited by epitaxy techniques (e.g. molecular beam, metal organic chemical vapor phase, physical vapor, etc.) in the case of ohmic regrowth for which either material contacts the 2DEG on the side as indicated in FIG. 1. In either case, an etch is performed to remove the barrier material and small portion of the AlN channel in regions where the source and drain electrodes are to be deposited. Alternatively, regions 27 and 29 could be rendered conductive without any etching or removal of the $\kappa\text{-Al}_2\text{O}_3$ and AlN by ion implantation of appropriate ion species (e.g. Si) to enable ohmic contact formation. After forming the source and drain electrode 26 and 28, the gate electrode 25 is formed in Schottky contact with the barrier layer 24, as shown.

Figures 2A, 2B:
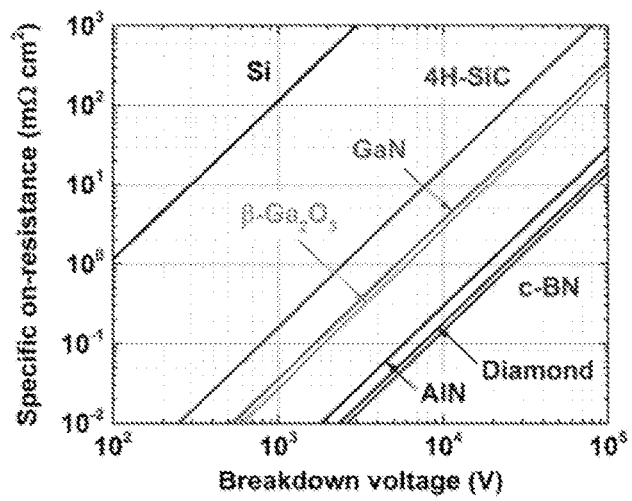
FIG. 2A is a chart showing various properties of different materials including GaN and AlN.
FIG. 2B is a plot showing breakdown voltage for various materials from the chart in FIG. 2A.

Referring now to FIGS. 2A and 2B, it should be appreciated, replacing GaN with AlN as channel material enables extremely high voltage operation in highly scaled transistors due to a very large breakdown strength as compared to GaN (>3× GaN); maintains a high gain at high voltage because of stronger carrier confinement with AlN vs GaN; provides a higher efficiency transistor due to higher thermal conductivity (>2× GaN) for improved thermal management; and employing AlN substrates further improves thermal management. Such a structure has a 10 times better $R_{ON}$-$V_{BRK}$ performance compared to existing (SiC, GaN) and emerging ($\beta\text{-Ga}_2\text{O}_3$) technologies for high power switching applications. Table and plot in FIGS. 2A and 2B, respectively, are from J. Y. Tsao, Adv. Electron. Mat., vol. 04, 1600501, 2018. With the high polarization properties of orthorhombic $\kappa\text{-Al}_2\text{O}_3$ (~3× of AlN) but also large bandgap of 7.7 eV (>1.5 eV higher than AlN), extremely high voltage operation can be obtained. $\kappa\text{-B}_2\text{O}_3$ has even larger bandgap of 11.3 eV and can also be used as a barrier layer.

It should be noted high density 2DEG is possible provided polarization of $\kappa\text{-Al}_2\text{O}_3$ barrier layer 24 is in same direction as AlN channel layer 22. In one embodiment, the $\kappa\text{-Al}_2\text{O}_3$ barrier layer is in a range of 3 to 15 nm and here approximately 4 nm thick.

Having described a $\kappa\text{-Al}_2\text{O}_3$/AlN HEMT structure above, it should be noted that the $\kappa\text{-Al}_2\text{O}_3$ barrier layer 24 can be replaced with a $\kappa\text{-B}_2\text{O}_3$, $\kappa\text{-}(Al_xB_{1-x})_2O_3$ or alternatively $\kappa\text{-}(Al_xB_yGa_{1-x-y}))_2O_3$ layer, provided the bandgap of the latter is larger than AlN.

A number of embodiments of the disclosure have been described. Nevertheless, it will be understood that various modifications may be made without departing from the spirit and scope of the disclosure. The composition of the channel and barrier layers do not need to be homogeneous throughout and may consist of multiple layers, multiple combinations of Group III elements, or gradients of Group III element compositions. Further, it should be understood that other single crystal substrates 18 may be used that enables the deposition of AlN with a single well defined crystalline orientation with respect to the substrate 18 crystal structure. This includes heterojunction structures formed via the deposition of one or more crystalline materials on another crystalline material or formed by bonding one or more layers together to define a surface region that is crystalline and supports the crystalline growth of AlN. Accordingly, other embodiments are within the scope of the following claims.

What is claimed is:

1. A semiconductor device, comprising:
   a polar oxide layer epitaxially and heterogeneously integrated above a wurtzite single-crystal Group III-Nitride layer comprising AlN;
   a source electrode disposed over a conductive region in the polar oxide layer and partway into the AlN;
   a drain electrode disposed over another conductive region in the polar oxide layer and partway into the AlN; and
   a gate electrode disposed between the source electrode and the drain electrode on top of the polar oxide layer.

2. The semiconductor device recited in claim 1, wherein the polar oxide layer comprises an alloy of orthorhombic polar oxide $\kappa\text{-Al}_2\text{O}_3$ and $\kappa\text{-B}_2\text{O}_3$.

3. The semiconductor device recited in claim 1, wherein the polar oxide layer comprises $\kappa\text{-B}_2\text{O}_3$.

4. The semiconductor device recited in claim 1, wherein the polar oxide layer comprises $\kappa\text{-Al}_2\text{O}_3$.

5. The semiconductor device recited in claim 1, wherein the polar oxide layer has a thickness in a range of 3 nm to 15 nm.

6. The semiconductor device recited in claim 1, wherein the semiconductor device is a depletion mode Field Effect Transistor.

7. A semiconductor device, comprising:
   a substrate;
   a polar oxide layer epitaxially and heterogeneously integrated above a wurtzite single-crystal Group III-Nitride layer comprising AlN disposed above the substrate;
   a source electrode disposed over a conductive region in the polar oxide layer and partway into the Group III-Nitride layer;
   a drain electrode disposed over another conductive region in the polar oxide layer and partway into the Group III-Nitride layer; and
   a gate electrode disposed between the source electrode and the drain electrode to provide a depletion mode Field Effect Transistor.

8. The semiconductor device recited in claim 7, wherein the polar oxide layer has a thickness in a range of 3 nm to 15 nm.

9. The semiconductor device recited in claim 7, wherein the source electrode and the drain electrode are in ohmic contact with the Group III-Nitride layer.

10. The semiconductor device recited in claim 7, wherein the polar oxide layer comprises $\kappa\text{-}Al_2O_3$.

11. The semiconductor device recited in claim 7, wherein the polar oxide layer comprises an alloy of $\kappa\text{-}Al_2O_3$ and $\kappa\text{-}B_2O_3$.

12. The semiconductor device recited in claim 7, wherein the polar oxide layer comprises $\kappa\text{-}B_2O_3$.

13. A semiconductor device, comprising:
   a single crystal substrate;
   an epitaxial AlN layer disposed above the substrate and forming nucleation, buffer, and channel regions of a High Electron Mobility Transistor (HEMT) structure; and
   a barrier layer comprising one or more epitaxial polar oxide materials disposed above the epitaxial AlN layer.

14. The semiconductor device recited in claim 13, wherein the single crystal substrate is one of: Si, SiC, diamond, or AlN.

15. The semiconductor device recited in claim 13, wherein the one or more epitaxial polar oxide materials comprise $\kappa\text{-}Al_2O_3$.

16. The semiconductor device recited in claim 13, wherein the one or more epitaxial polar oxide materials comprise $\kappa\text{-}B_2O_3$.

17. The semiconductor device recited in claim 13, wherein the one or more epitaxial polar oxide materials comprise an alloy of $\kappa\text{-}Al_2O_3$ and $\kappa\text{-}B_2O_3$.

18. The semiconductor device recited in claim 14, wherein the barrier layer has a thickness in a range of 3 nm to 15 nm.

19. The semiconductor device recited in claim 1, wherein the source electrode and the drain electrode are in ohmic contact with the Group III-Nitride layer.

20. The semiconductor device recited in claim 1, further comprising a single crystal substrate including one of: Si, SiC, diamond, or AlN.

* * * * *